United States Patent
Solovyov et al.

(10) Patent No.: US 7,622,426 B2
(45) Date of Patent: Nov. 24, 2009

(54) METHODS OF CONTROLLING HYDROGEN FLUORIDE PRESSURE DURING CHEMICAL FABRICATION PROCESSES

(75) Inventors: Vyacheslav Solovyov, Rocky Point, NY (US); Harold Wiesmann, Stony Brook, NY (US)

(73) Assignee: Brookhaven Science Associates, LLC, Upton, NY (US)

( * ) Notice: Subject to any disclaimer, the term of this patent is extended or adjusted under 35 U.S.C. 154(b) by 672 days.

(21) Appl. No.: 11/245,138

(22) Filed: Oct. 6, 2005

(65) Prior Publication Data

US 2006/0079404 A1   Apr. 13, 2006

Related U.S. Application Data

(60) Provisional application No. 60/620,443, filed on Oct. 7, 2004.

(51) Int. Cl.
*H01L 39/24* (2006.01)
*C23C 4/04* (2006.01)

(52) U.S. Cl. .................. 505/473; 505/434; 505/470; 252/519.1; 252/520.2; 427/62; 29/599; 423/594.12

(58) Field of Classification Search ............. 505/470, 505/500, 434, 447; 427/62, 380; 252/62.9 PZ, 252/500, 190, 520.5; 501/134–137; 29/599; 423/594, 598, 240 R, 483, 489
See application file for complete search history.

(56) References Cited

U.S. PATENT DOCUMENTS

| | | | |
|---|---|---|---|
| 3,699,209 A * | 10/1972 | Ward ................. | 423/240 R |
| 3,833,711 A * | 9/1974 | Villiers-Fischer ...... | 423/244.08 |
| 5,231,074 A | 7/1993 | Cima et al. | |
| 5,572,060 A * | 11/1996 | Butler et al. ................. | 257/467 |
| 5,597,515 A * | 1/1997 | Kauffman et al. ....... | 252/519.12 |
| 6,172,009 B1 * | 1/2001 | Smith et al. .................. | 505/473 |
| 6,797,313 B2 * | 9/2004 | Fritzemeier et al. ........... | 427/62 |
| 2003/0050195 A1 | 3/2003 | Wiesmann et al. | |
| 2005/0014032 A1 | 1/2005 | Wiesmann et al. | |

OTHER PUBLICATIONS

Kuchma et al, "Purification of fluoride-cantaining gases on a fluidized sorbent bed," Chemical and Petroleum Engineering, Springer, New York, 1991, May, V 27, No. 5; pp. 265-268.*

Solovyov, et al., "A New Method of HF Control for Synthesizing BYCO Using the BaF$_2$ ex situ Process", *Superconductor Science and Technology*, 16, 2003, pp. L37-L39.

Chan, et al. Appl. Phys. Lett. 53, 1443 (1988).

Cui, et al. "Continuous deposition of ex situ YBCO precursor films on rolling-assisted biaxially textured substrates by electron beam evaporation," Physica C 351, 175 (2001).

(Continued)

*Primary Examiner*—Stanley Silverman
*Assistant Examiner*—Kallambella Vijayakumar
(74) *Attorney, Agent, or Firm*—Dorene M. Price

(57) ABSTRACT

The present invention is a method for producing a crystalline end-product. The method comprising exposing a fluoride-containing precursor to a hydrogen fluoride absorber under conditions suitable for the conversion of the precursor into the crystalline end-product.

19 Claims, 3 Drawing Sheets

OTHER PUBLICATIONS

Mankiewich, et al. "Reproducible technique for fabrication of thin films of high transition temperature superconductors," Appl. Phys. Lett. 51, 1753 (1987).

McIntyre, et al. "Metalorganic deposition of high-Jc $Ba_2YCu_3O_{7-x}$ thin films from trifluoroacetate precursors onto $(100)SrTiO_3$," J. Appl. Phys. 68, 4183 (1990).

P.J. Linstrom and W.G. Mallard, NIST Chemistry WebBook (NIST Standard Reference Database No. 69, Jul. 2001) National Institute of Standards and Technology, Gaithersburg, MD.

Solovyov, et al. "Thick YBCO films by post annealing of the precursor by high rate e-beam deposition on $SrTiO_3$ substrates," Physica C 309, 269 (1998).

Solovyov, et al. "Growth rate limiting mechanisms of $YBa_2Cu_3O_7$ films manufactured by ex situ processing," Physica C 353, 14 (2001).

Solovyov, et al. "Ex-situ post-deposition processing for large area YBCO films and coated tapes," Applied Superconductivity, 11, 2939 (2001).

Solovyov, et al. "A new method of HF control for synthesizing YBCO using the BaF2 ex situ process," Supercond. Sci. Technol. 16, L37 (2003).

Feenstra, et al., "Properties of Low Temperature, Low Oxygen Pressure Post-annealed $YBa_2Cu_3O_{7-x}$ Thin Films", Proc. Sym. A-1 on High Temp. Supercond. Films at the Int. Conf. on Adv. Mater. (Strasbourg, France) ed. L. Correra (Amsterdam, North Holland), p. 331 (1991).

* cited by examiner

METHODS OF CONTROLLING HYDROGEN FLUORIDE PRESSURE DURING CHEMICAL FABRICATION PROCESSES

CROSS-REFERENCE TO RELATED APPLICATION

This application claims the benefit of U.S. Provisional Application No. 60/620,443, filed Oct. 7, 2004, which is incorporated herein by reference in its entirety.

This invention was made with Government support under contract number DE AC02-98CH10886, awarded by the U.S. Department of Energy. The Government has certain rights in the invention.

BACKGROUND OF THE INVENTION

Materials with highly-oriented atomic structures exhibit properties that are necessary for diverse applications, such as superconductors, optical devices, and microelectronics.

For example, superconducting ceramic films and coatings require highly-oriented atomic structures to maximize superconducting critical current density ($J_C$). Current density is a vector quantity whose magnitude is the ratio of the magnitude of current flowing in a conductor to the cross-sectional area perpendicular to the current flow. Examples of such films and coatings include rare earth-alkaline earth metal-cuprates (i.e., YBCO), such as $YBa_2Cu_3O_7$.

Optical devices, such as optic shutters and waveguide devices; and microelectronics utilize ferroelectric materials. A high degree of atomic orientation of ferroelectric materials is necessary in optical devices to minimize optical propagation loss. Such orientation is necessary in microelectronics to minimize dielectric constants, and to allow for stable and constant resistivity. Examples of ferroelectric materials include perovskite-type materials, such as, for example, $Pb(Zr,Ti)O_3$ and $(Ba,Sr)TiO_3$.

The superconducting ceramic and perovskite-type materials can be deposited as precursors onto supporting materials, termed substrates. Substrates can range from being a single crystal to being a whole article, i.e., tape, wire, wafer, etc. After the precursor is deposited, it is converted into a highly-oriented atomic structure. The particular substrate upon which a precursor is converted, and the particular conditions under which conversion takes place, significantly determine the type and degree of atomic orientation that a converted precursor, and thus its respective end-product, will exhibit.

In general, to achieve a high degree of orientation, a precursor is deposited on a substrate that allows for oriented crystalline growth, i.e., epitaxial growth, and that primarily produces end-products with no grain boundaries, or, in certain cases, low angle grain boundaries. Single crystalline structures, and in particular single crystals, allow for better epitaxial and heteroepitaxial growth and thus provide a higher degree of atomic orientation vis-à-vis polycrystalline structures.

For example, YBCO films, grown on epitaxial single crystals, have exihibited current densities of $4 \times 10^6$ amps/cm$^2$ at 77K. In contrast, current densities are drastically reduced when YBCO films are grown on untextured polycrystalline structures. In such cases, the number of crystal grain boundaries are increased thereby producing "weakly linked" crystalline structures.

The inclusion of fluorine into precursors allows for the production of end-products with a high degree of atomic orientation. It is thought that fluorine enhances the transfer of the crystalline order of a substrate to the growing material, i.e., enhances epitaxial and heteroepitaxial growth. The incorporation of fluorine also allows for the use of more stable materials in the manufacture of the precursor. For example, barium metal is difficult to handle because it rapidly oxidizes in air, especially in the presence of water vapor. In contrast, YBCO precursors can be fabricated using $BaF_2$, a material that is stable in air.

However, it has been found that the inclusion of fluorine in precursors can lead to the accumulation of hydrogen fluoride (HF) gas in reaction vessels during the conversion process. There are many obstacles associated with the accumulation of HF gas in reaction vessels.

For example, the accumulation of HF gas during the conversion of YBCO fluorinated precursors to crystalline YBCO is a rate-limiting step to such conversion (Physica C 353:14-22 (2001)). In particular, it is estimated that the HF equilibrium vapor pressure reaches about 10 milliTorr in a closed reactor. Such pressure is sufficient to stop the growth of an YBCO film.

Techniques to extract HF gas quickly enough to avoid the suppression of crystalline YBCO growth have been used. For instance, the flow of gas in a reactor has been increased to effect faster removal of HF gas by gaseous convection. However, for any economically meaningful length of conductor in a tubular reactor, the degree of gas flow required becomes unreasonably high.

The accumulation of HF gas during the conversion of YBCO fluorinated precursors to crystalline YBCO has other drawbacks. For instance, in order to achieve uniform and homogeneous growth of crystalline YBCO film, the HF gas should be uniformly extracted perpendicular to the surface of the growing YBCO film. This can be achieved for small samples with flat geometries by placing a suitably designed pump aperture over the film surface. However, for large areas, or for geometries other than flat, this method is not practical.

Additionally, the pump aperture extracts water vapor and oxygen that are required for the conversion of the precursor to crystalline YBCO. Thus, oxygen and water vapor must be re-injected. Since any component of gas flow parallel to the surface will cause the HF partial pressure to become non-uniform, the oxygen and water vapor must be re-injected perpendicular to the film surface. This can be approximately achieved hydrodynamically for laboratory-sized samples where the relevant distances are measured in mm. However, for large areas, or for geometries other than flat, the injection of the gases becomes impractical if not impossible.

Accordingly, there is a need in the art for an efficient method to remove HF gas from chemical fabrication processes that yields high quality crystalline end-products.

SUMMARY OF THE INVENTION

The invention includes methods for producing crystalline end-products. The methods comprise exposing a fluoride-containing precursor to a hydrogen fluoride (HF) absorber under conditions suitable for the conversion of the precursor into the crystalline end-product. Preferably, the conditions suitable for the conversion of the precursor into the crystalline end-product comprises the presence of a hydrogen-containing gas.

The HF-absorber can comprise an alkaline earth oxide, such as, for example, SrO or BaO. Also, the HF-absorber can comprise an alkaline earth peroxide, such as, for example, $SrO_2$ or $BaO_2$. Additionally, the HF-absorber can comprise a compound containing calcium, such as, for example, CaO, $CaO_2$, $CaOH_2$ or limestone. Further, the HF-absorber can comprise a compound containing sodium, such as, for example, NaOH, NaHCO$_3$, or Na$_2$CO$_3$. Also, the HF-absorber can comprise activated carbon.

In one embodiment of the present invention, the end-product is a superconductor. In this embodiment, preferably the precursor is a rare earth-alkaline earth metal-cuprate precursor. An example of a rare earth-alkaline earth metal-cuprate precursor is YBa$_2$Cu$_3$O$_y$. Preferably, y is seven.

In another embodiment, the end-product is a ferroelectric material. In this embodiment, preferably the precursor comprises Pb(Zr,Ti)O$_3$ or (Ba,Sr)TiO$_3$.

In another aspect, the invention includes a crystalline end-product produced by a method comprising exposing a fluoride-containing precursor to a HF-absorber under conditions suitable for the conversion of the precursor into the crystalline end-product. The crystalline end-product can be a superconductor, an optical device, or a microelectronic device.

In a further aspect, invention relates to HF-absorbing compartments for converting precursor materials to crystalline end-products. The compartments have HF-absorbers on their inner surfaces. The compartments enclose and conform in shape to precursor materials.

The methods of producing crystalline end-products from fluorinated superconducting ceramic precursors and perovskite-type precursors in accordance with the present invention provide several advantages over current methods.

Current methods of extracting HF gas from a reaction vessel are by increasing the flow of gas through the vessel. Typically, a pump aperture is placed at the end of the reaction vessel containing the growing end-product. Such methods do not allow for the quick extraction HF gas, thereby suppressing the growth of the end-product. Additionally, uniform extraction of HF gas across large areas is not feasible thereby yielding end-products which are not uniform and not homogeneous. Also, the uniformity and homogeneity of end-products which have other than flat structures are especially compromised. Furthermore, along with the HF gas, the pump aperture extracts water vapor and oxygen which are necessary for forming most crystalline end-products.

The advantages of the methods of the present invention include allowing the quick extraction of HF gas from a reaction vessel to avoid suppressing the growth of a crystalline end-product. Additionally, the present methods allow for uniform extraction of HF gas across large areas thereby yielding crystalline end-products which are uniform and homogeneous regardless of the size of the area. Furthermore, since the present methods allow for making HF absorbers that conform to the shape of a growing end-product, uniformity and homogeneity of end-products which have other than flat structures are achieved. Moreover, the present methods selectively remove HF gas from the reaction vessel thereby leaving the water vapor and oxygen which are necessary for forming most crystalline end-products.

DETAILED DESCRIPTION OF THE INVENTION

Figure 1:
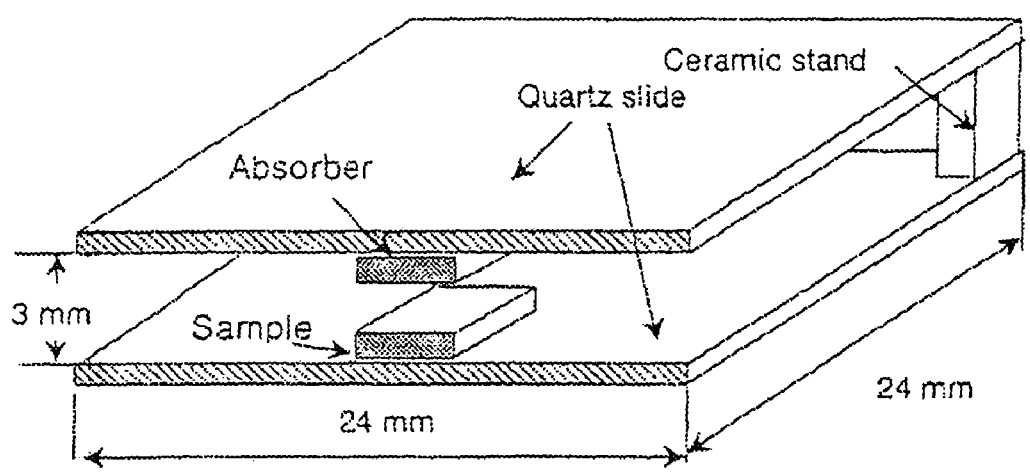
FIG. 1 is a view of a three-dimensional cross section of the sample-absorber apparatus used for processing YBCO films.

The present invention is related to crystalline end-products, and methods of making the same. In particular, the methods of the present invention are suitable for the conversion of a fluoride-containing precursor into a crystalline end-product.

The inclusion of fluorine in precursor materials enhances the transfer of the crystalline order of a substrate to the growing end-product while the precursor material is being converted into its end-product. Methods by which such precursor materials are converted into crystalline end-products release hydrogen fluoride (HF) gas.

Examples of precursor materials include superconducting ceramic and ferroelectric precursors.

Examples of precursors of superconducting ceramics include oxide superconductors of the rare earth metal-alkaline earth metal-cuprate family of superconductors. Examples of suitable rare earth metals include yttrium, neodymium, ytterbium, europium, gadolinium, dysprosium, holmium and samarium. These metals can be used alone or in combination. More preferably, the precursors comprise the rare earth metal-barium-cuprate family. In the most preferred embodiment, the rare earth-barium-cuprate is YBa$_2$Cu$_3$O$_y$, (YBCO), where y is a value sufficient to impart superconductivity at temperatures of at least 77 K. The value of y is dependent on the process conditions used to produce a particular cuprate superconductor. Typically the value of y is seven.

Examples of precursors of ferroelectric materials include perovskite-type precursors, such as, for example, Pb(Zr,Ti)O$_3$ and (Ba,Sr)TiO$_3$.

The methods of the invention comprise exposing a fluoride-containing precursor to a solid hydrogen fluoride absorber under conditions suitable for the conversion of the precursor into the crystalline end-product. The HF-absorber removes HF gas thereby controlling the partial pressure of HF gas within a reaction vessel.

The solid hydrogen fluoride absorber is any entity that removes HF gas by chemical or physical absorption. Examples of hydrogen fluoride absorbers are compounds comprising alkaline earth oxides, peroxides, hydroxides; compounds containing calcium; compounds containing sodium; and compounds containing activated carbon. These compounds can be used alone or in combination.

Examples of alkaline earth oxides suitable as HF-absorbers include SrO and BaO. Examples of suitable alkaline earth peroxides include SrO$_2$ and BaO$_2$. Examples of compounds that contain calcium suitable for the methods of the invention include CaO, CaO$_2$, CaOH$_2$ and limestone (CaCO$_3$). Examples of compounds that contain sodium suitable for the methods of the invention include NaOH, NaHCO$_3$, Na$_2$CO$_3$.

HF-absorbers can be in any solid form. For example, HF-absorbers can be deposited onto a support. For instance, HF absorbers can be sprayed or painted onto a support. The supports can be made out of any type of material that is inert to the manufacture and conversion of a precursor. Examples of materials that can be used to make the supports include quartz, aluminum oxide, magnesium oxide, and cerium oxide.

Alternatively, instead of depositing the HF-absorber onto a support, the HF-absorber is free-standing. For example, a HF-absorbing powder can be pressed into a form, such as, for example, a sheet, pebbles, or pellets.

In a preferred embodiment, the surface of the HF-absorber is placed at a uniform distance from the entire surface of a growing end-product. Placing the absorber at a uniform distance enables the formation of a uniform and homogenous end-product. Preferably, the surface of the HF-absorber is as smooth as possible.

Since the substrate upon which a precursor material is placed can be a variety of shapes and sizes, preferably, the HF-absorbers are shaped to conform to the particular size and shape of a growing end-product. For example, HF-absorbers can be deposited onto supports that conform to the size and shape of a growing end-product. Alternatively, a HF-absorbing powder can be pressed into a form that conforms to the size and shape of a growing end-product.

The HF-absorber is preferably in the form of a compartment that encloses a growing end-product. The compartment has a HF-absorber, as described above, deposited on the surface that faces the growing end-product (i.e., the inner surface). Alternatively, the compartment is made of a free-standing HF-absorber pressed into the form of a compartment. The compartment encloses the whole growing precursor with the HF-absorbing surface in close proximity with the precursor surface. Preferably, the HF-absorbing surface follows the contours of a growing end-product at a uniform distance thereby allowing the formation of a uniform and homogeneous end-product.

The HF-absorbing surface is placed as close to the precursor as necessary to achieve the desired uniformity of conversion. The space between a precursor and a HF-absorbing surface defines the reactor. The distance of the space depends upon the particular precursor and reaction conditions, as would be known to one skilled in the art. For example, the distance can range from approximately 1 mm to about 10 cm. Typically, the distance depends upon, for example, the gas pressure, temperature and convection currents in a reaction vessel, and the desired growth rate of an end-product. Preferably, the HF-absorbing surface is closer to the precursor than the smallest lateral dimension of the precursor.

For example, a substrate in the form of a cylinder 2 m in length and 1 m in diameter is uniformly wrapped with a YBCO precursor-coated flexible tape 1 cm wide. The tape length is about 600 m. This cylinder is placed inside a slightly larger cylinder of the same length where the inside of the larger cylinder is coated with a layer of a HF-absorber. The space between the HF-absorber and the precursor surface is approximately 2 mm.

The use of a HF-absorber that conforms to the shape of the growing end-product simplifies calculation of the reactor geometry. Instead of complex diffusion and convection equations, the HF transport is the simple case of diffusion between the growing end-product and the surface of the HF-absorber. The distance between the growing end-product and the absorber determines the growth rate. As the distance increases, the growth rate decreases.

The thickness of a HF-absorber can be any thickness that allows for sufficient HF absorption. For example, the HF-absorber can be thick enough to allow for the complete conversion of a particular precursor. The thickness depends upon, for example, the precursor type, process conditions, and the desired lifetime of the HF-absorber. For instance, the thickness can vary from about 0.5 μm to 5 mm for a HF-absorber deposited upon a support. Alternatively, a free-standing HF-absorber can be several inches thick.

The amount of HF-absorber available for conversion to a fluoride limits the lifetime of an absorber (e.g., the conversion of BaO or SrO to $BaF_2$ or $SrF_2$, respectively). For example, a one millimeter thick BaO film can process about 1000 μm of YBCO before needing to be replaced.

Once placed in close proximity with a HF-absorber, a precursor is then converted under conventional heating conditions into a crystalline end-product by annealing in the presence of a hydrogen-containing gas, such as, for example, water vapor.

Many conversion reactions require water and oxygen. For example, the conversion of YBCO precursors into superconductors comprises heating the fluorinated precursor and exposing it to an atmosphere of water vapor and oxygen. In particular, the fluorinated precursor is heated at a temperature of about 500° C. to about 900° C., in the presence of oxygen, water vapor, and optionally a carrier gas, preferably nitrogen, at sub-atmospheric pressure. This process is described in U.S. Application Publication No. 2003/0050195, which publication is incorporated herein by reference in its entirety. In another embodiment, the fluorinated precursor is heated at atmospheric pressure. This process is described in Solovyov et. al. "Growth rate limiting mechanisms of $YBa_2Cu_3O_7$ films manufactured by ex situ processing," Physica C., 353:14 (2001) which publication is incorporated herein by reference in its entirety.

The HF-absorbers of the present invention selectively absorb HF gas. Thus, water, oxygen, and/or other gases that may be present remain in the reaction vessel. Accordingly, the present invention allows for conversion reactions to be conducted without injection of water and/or of oxygen into the reaction vessel, i.e., the conversion of a precursor (e.g., a YBCO precursor) to a crystalline end-product takes place in a static mode.

Under certain conditions it may be necessary to replenish the water, oxygen, and/or other gases that might be present in the reaction vessel. For example, this could occur if the precursor was reacting with one or more of the gases in the reaction vessel and insufficient gas was available for the reaction to go to completion. This would be understood by those skilled in the art.

After heating by any method, the crystalline end-product may be annealed in oxygen to optimize its properties. (For example, YBCO is preferentially annealed in oxygen.) The end-products, obtained from these methods, contain only trace amounts of fluorine.

Techniques to include fluorine during the growth of ceramic precursors could be broadly divided into two categories. These categories are physical deposition methods and chemical methods.

Physical deposition methods include reactive evaporation, magnetron sputtering, electron beam deposition and laser ablation. In these methods, fluorine is typically introduced into a precursor film as a fluoride-bearing molecule, such as, for example, barium fluoride.

For example, a process to make films of YBCO using coevaporation of Y, Cu, and $BaF_2$ on $SrTiO_3$ substrates is described in "Reproducible technique for fabrication of thin films of high transition temperature superconductors," Mankiewich et al., Appl. Phys. Lett. 51:1753 (1987), incorporated herein in its entirety. Also, a reel-to-reel electron beam evaporation system continuously deposits Y—$BaF_2$—Cu precursor for ex situ YBCO processed films ("Continuous deposition of ex situ YBCO precursor films on rolling-assisted biaxially textured substrates by electron beam evaporation"; Feenstra et al., Proc. Sym. A-1 on High Temp. Supercond. Films at the Int. Conf. on Adv. Mater. (Strasbury. France) ed. L Correra (Amsterdam, North Holland) p. 331 (1991), incorporated herein by reference). Additionally, high rate evaporation techniques can be used to deposit Y, $BaF_2$, and Cu precursor films onto $SrTiO_3$ single crystal substrates at rates in excess of 10 nm/s ("Thick YBCO films by post annealing of the precursor by high rate e-beam deposition on $SrTiO_3$ substrates" Solovyov et al., Physica C 309:269 (1998), incorporated herein by reference in its entirety).

Chemical methods are largely based upon thermally activated chemical reactions of precursors during film formation.

A precursor is deposited onto a substrate, and later transformed through chemical reactions. Typically, in these methods, fluorine is introduced into the precursor film as solutions containing trifluoroacetates.

An example of a chemical method is metalorganic chemical vapor deposition (MOCVD). Another example is a metalorganic solution deposition (MOD) preparation of $Ba_2YCu_3O_{7-x}$, superconductor films described in U.S. Pat. No. 5,231,074, incorporated herein by its entirety. In this method, the deposition is done using metal trifluoroacetates on a single crystal of $SrTiO_3$ or $LaAlO_3$. Additionally, superconducting thin films of $Ba_2YCu_3O_{7-x}$ prepared on (100) $SrTiO_3$ substrates by MOD of trifluoroacetate precursors is described in "Metalorganic deposition of high-$J_c$ $Ba_2YCu_3O_{7-x}$ thin films from trifluoroacetate precursors onto (100) $SrTiO_3$," McIntyre et al., J. Appl. Phys. 68:4183 (1990), incorporated herein in its entirety.

Other examples of methods for fluorinating precursor films are described in U.S. Application Publication No. 2005/0014032 (U.S. Ser. No. 10/622,843), which is incorporated herein by reference in its entirety. A precursor solution is sprayed onto a substrate which is then heated in an atmosphere containing fluorinated gas; alternatively, a precursor solution and fluorinated gas are sprayed onto a substrate.

A hybrid process, known as an ex situ process, combines physical deposition and chemical methods. In particular, this process includes the physical deposition of a precursor film which is then processed outside of the physical deposition chamber by conventional chemicothermal processes (Chan et al. Appl. Phys. Lett. 53(15):1443 (October 1988), incorporated herein by reference in its entirety). This process involves uniform codeposition of $CuO$, $Y_2O_3$, and $BaF_2$ in the correct stoichiometric ratio onto a substrate. Additionally, YBCO films fabricated on $SrTiO_3$ substrates using the $BaF_2$ ex situ process are described in "Growth rate limiting mechanisms of YBCO films manufactured by ex situ processing," Solovyov et al. Physica C 353 14 (2001), incorporated herein by reference in its entirety. Also, "Ex-situ post-deposition processing for large area YBCO films and coated tapes," Solovyov et al. IEEE Trans. Applied Superconductivity, 11(1): 2939-2942 (March 2001) is incorporated herein by reference in its entirety.

In a preferred embodiment of the present invention, HF gas is removed in the ex situ processing of large area YBCO precursor-coated superconductors employed in the $BaF_2$ process.

The thicknesses of the crystalline end-products vary depending on the end use application, as known by a skilled artisan. For example, YBCO films range in thickness from about 0.05 to about 10 microns.

Substrates provide support upon which a precursor grows. The substrate can be any material that is not deleteriously affected by the processing conditions and chemicals used to prepare the crystalline end-products, or by the final uses of the end-product. For example, a substrate used with a superconductor has a low Curie temperature so that the substrate is not ferromagnetic at the superconducting ceramic's application temperatures. Furthermore, chemical species within a substrate preferably should not be able to diffuse into the layer of the end-product, and the coefficient of thermal expansion of the substrate preferably should be about the same as the crystalline end-product. Also, the substrate preferably should be relatively resistant to oxidation.

The substrate can be substantially a single crystal, single crystalline ceramic, polycrystalline ceramic or a metal. Preferably, a substrate is chosen which promotes epitaxial growth of the end-product. Examples of substrates that promote epitaxial growth include ceramic crystalline materials that have similar lattice constants with the end-product, and substrates that are substantially a single crystal which has a lattice constant which is similar to the end-product. For example, the nucleating superconducting precursor preferentially aligns its principle axes with the principle axes of the substrate to thereby obtain ordered crystal growth and orientation of the oxide film, i.e., epitaxy. Such order results in an oxide superconductor in which each axis is substantially completely aligned. In this manner, the substrate transfers its crystalline order to the growing superconducting ceramic, allowing for higher critical currents.

Examples of suitable crystalline substrates include, but are in no way limited to, $SrTiO_3$, $LaAlO_3$, $Y_2O_3$, zirconia, preferably stabilized zirconia, such as yttria-stabilized zirconia (YSZ), $ZrO_2$, $CeO_2$, $SrRuO_3$ and $MgO$. Examples of suitable metal substrates include nickel (Ni); silver (Ag); alloys comprising Ni; and alloys comprising Ag.

Preferably, in embodiments using metal substrates, at least one buffer layer is placed between the substrate and the precursor. The buffer layer(s) can be more resistant to oxidation than the substrate, and reduce the diffusion of chemical species between the substrate and the end-product. Moreover, the buffer layer(s) can have a coefficient of thermal expansion that is well matched with the end-product material.

Typically, a buffer layer is an epitaxial layer, so its crystallographic orientation is directly related to the crystallographic orientation of the surface onto which the buffer layer is deposited. For example, in a multi-layer end-product having a substrate, an epitaxial buffer layer and an epitaxial layer of end-product material, the crystallographic orientation of the surface of the buffer layer is directly related to the crystallographic orientation of the surface of the substrate, and the crystallographic orientation of the layer of end-product material is directly related to the crystallographic orientation of the surface of the buffer layer. Therefore, the properties exhibited by a multi-layer end-product having a buffer layer can depend upon the crystallographic orientation of the buffer layer surface.

Suitable buffer layers include, but are not limited to, zirconia, $LaAlO_3$, $SrTiO_3$, $CeO_2$, $MgO$, $Y_2O_3$, $TbO_x$, $GaO_x$, $Gd_2O_3$, $LaNiO_3$, $LaCuO_3$, $NdGaO_3$, $NdAlO_3$, $CaF_2$, $AlN$, $NbN$, $TiN$, $VN$, $ZrN$, $NiO$, $Ag$, $MgF_2$, $LaMnO_3$, $La_2Zr_2O_7$, $Gd_2Zr_2O_7$, $Ba_2Zr_2O_7$ or doped compounds thereof. The bulk portion of the buffer material can have a texture selected from the group consisting of biaxial texture and cube texture.

In one embodiment of the invention, the substrate can be an article. For example, an article can be a metallic substrate selected for durability and/or flexibility, e.g., a wire, a tape, a wafer, a ribbon, etc. Preferably, an article is coated with a buffer layer that is compatible with the growing precursor. For example, the article is preferably coated with a buffer layer which contains some degree of crystallographic alignment, and which is reasonably lattice-matched with the precursor.

In another embodiment, the invention includes crystalline end-products produced by the methods of the invention. Examples of crystalline end-products include superconductors, optical devices, and microelectronics. Examples of optical devices include optic shutters and waveguide devices.

EXAMPLES

Formation of the Precursor Film

YBCO precursor films 1 µm thick were deposited on 10 mm×3 mm×0.5 mm thick $SrTiO_3$ single-crystalline polished substrates by vacuum co-evaporation of Y, $BaF_2$ and Cu as described in Solovyov et al., Physica C 309:269 1998. Results are presented for YBCO precursor films processed at 735° C. in a tubular reactor at atmospheric pressure with an oxygen partial pressure of 100 mTorr, water partial pressure 30 Torr, and balance nitrogen. The growth rate was determined by measuring the conductance of the growing YBCO film (Solovyov et al., IEEE Trans. Supercond. 11:2939 (2000)) during processing as the film was converted from an insulating YBCO precursor to a homogeneous crystalline YBCO film.

Formation of the HF Absorber

The HF absorber was a film of BaO, 10 µm thick, deposited on either a quartz slide or $SrTiO_3$ substrate. The BaO films were synthesized by spraying a 1 wt % barium nitrate water-based solution onto a heated substrate. The substrates were heated to 600° C. and the $BaNO_3$ stream was produced by ultrasonic excitation. The solution decomposed on the hot substrate surface leaving behind a relatively smooth layer of barium oxide. X-ray diffraction of the as-deposited absorber confirmed that it consisted of cubic barium oxide.

An alternative method for synthesizing the absorber was to paint an emulsion of barium peroxide onto a room temperature substrate. Barium peroxide is relatively stable in a lab environment and can be painted on a smooth surface as a water emulsion and allowed to dry. The resulting layers were calcined at 500° C. in air to impart some mechanical strength. It was found that both types of absorber worked equally well.

HF Absorption Experiment

To prove the concept of HF absorption by BaO, an experimental set up was designed as shown in FIG. 1. Normally, in ex situ processing, a YBCO precursor film is processed in a "free-standing" mode, that is, the film surface is completely exposed to the gaseous processing atmosphere. As shown previously in "Growth rate limiting mechanisms of $YBa_2Cu_3O_7$ films manufactured by ex situ processing," Solovyov V F; Wiesmann H J; Wu L and Suenaga M Physica C 353:14 (2001) and incorporated herein by reference in its entirety, in this processing mode the YBCO growth rate is determined by the HF diffusion profile. A simple analysis of rectangular substrates predicts that the HF diffusion rate is approximately proportional to the smallest lateral substrate dimension. For free-standing substrates 10 mm×3 mm, the diffusion path would be about 3 mm long.

However, if a quartz slide is placed above the sample, as shown in FIG. 1, without the absorber, HF diffusion perpendicular to the substrate surface is mechanically restricted. For the geometry shown in FIG. 1, the diffusion path is about 12 mm.

Longer diffusion paths cause increased impedance to HF diffusion and this increases the HF partial pressure at the substrate surface. The geometry of FIG. 1, without the absorber, should decrease the YBCO growth rate by a factor of about 4 as compared to a substrate in the "free-standing" mode.

However, if the quartz slide is coated with a BaO absorber, the HF diffusion path is equal to distance from the absorber to the surface of the YBCO precursor coated substrate, which is ~3 mm as shown in FIG. 1. Again a shorter diffusion path means faster YBCO growth. If the BaO absorber is closer to the substrate than the smallest dimension of the substrate, then it is possible to achieve a YBCO growth rate in excess of that achievable for a substrate in the "free-standing" mode. In addition, except near the edges of the substrate, the bulk of the HF diffusion will be normal to the YBCO precursor coated substrate surface allowing for uniform and homogeneous YBCO growth over the bulk of the substrate surface.

Figure 2:
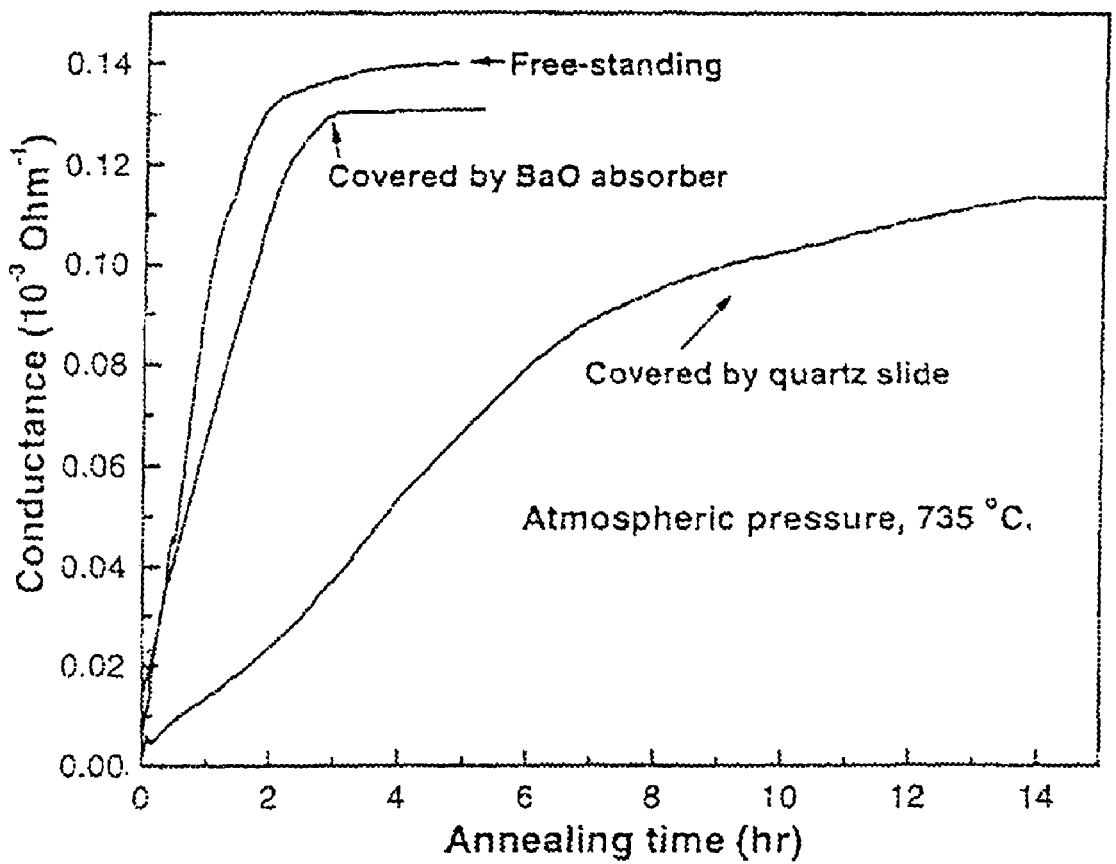
FIG. 2 is a plot of conductance versus time for three YBCO films processed at atmospheric pressure.

Plotted in FIG. 2 is conductance versus time for three 1 µm thick YBCO samples processed under conditions described previously. The point of inflection for the sample labeled "free-standing" and the sample labeled "covered by BaO absorber" indicates completion of the YBCO growth and is used to calculate an average YBCO growth rate of about 0.12 nm $s^{-1}$ for both samples. The "covered by quartz slide" sample is seen to grow much slower, about 0.03 nm $s^{-1}$. Note that the free-standing sample grew about four times faster than the sample covered with a quartz slide, consistent with the ratio of diffusion path lengths being 4/1 as discussed previously.

Also note that the addition of the BaO absorber increases the growth rate by about four times and implies an effective diffusion path length of about 3 mm, equivalent to the free-standing sample, even though the sample is covered by a quartz slide as shown in FIG. 1. Finally it should be noted that the growth of the "covered by BaO absorber" sample appears to be very uniform as indicated by the excellent linearity of the conductivity prior to the inflection point.

$J_c$ values in excess of 1 MA $cm^{-2}$ were obtained for all three samples. Experiments were also performed at reduced pressures and similar results were obtained demonstrating that the technique works at low water partial pressure.

Figure 3:
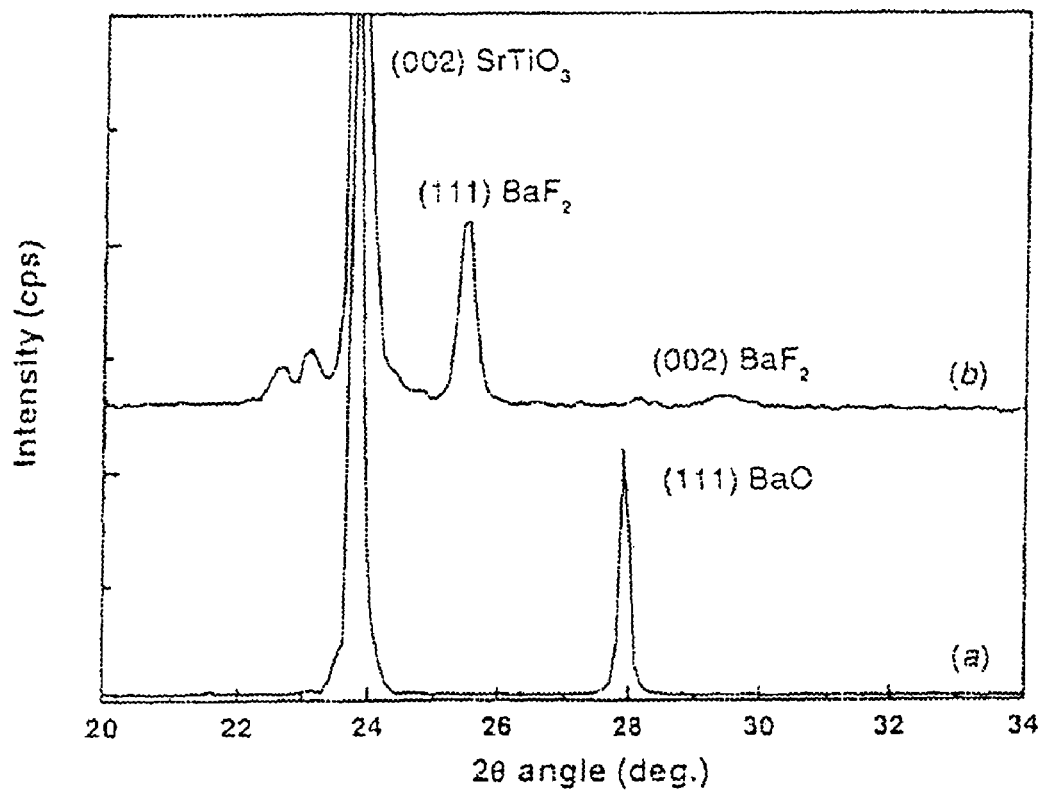
FIG. 3. is the X-ray diffraction spectra (a) for an as-deposited 0.1 μm thick BaO absorber on SrTiO$_3$ and the same sample (b) after YBCO processing, demonstrating the conversion of BaO to BaF$_2$.

To confirm that the absorption of HF results in the chemical conversion of BaO to $BaF_2$, a thin BaO film, 0.1 µm thick, was deposited onto a $SrTiO_3$ substrate. The BaO film was placed above a YBCO precursor film and processed in the geometry of FIG. 1. The BaO film was thin enough so that it could be completely converted into $BaF_2$ assuming the BaO absorber film absorbed all the HF released by the precursor film during the growth of the crystalline YBCO. FIGS. 3(a) and (b) compare x-ray diffraction scans of the $BaO/SrTiO_3$ film before and after processing, respectively. A strong BaO (111) peak is evident in FIG. 3(a) and after processing the BaO peak is absent and a strong $BaF_2$ (111) peak is present in FIG. 3(b) confirming that the BaO is converted to $BaF_2$ during the YBCO growth.

In the ex situ process, a fluorinated precursor is converted to YBCO according to the following schematic reaction:

$$2(Y\text{—}Ba\text{—}Cu\text{—}O\text{—}F)(\text{precursor}) + H_2O \leftrightarrow YBa_2Cu_3O_7 + 2HF \quad (1)$$

An important parameter in reaction (1) is the equilibrium constant, $K_e$, which relates the partial pressures of water vapor, $p(H_2O)$, and HF, $p(HF)$, at the growth front:

$$[p(HF)]^2/p(H_2O) = K_e \quad (2)$$

It is estimated that at 735° C., $K_e = 1.1 \times 10^{-8}$, which means that at a typical value of the water vapor partial pressure, $p(H_2O) = 25$ Torr, $p(HF) \approx 10$ mTorr. A simple mechanism for the absorption of HF would be the following reaction:

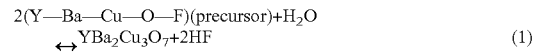

Due to the presence of water vapor during processing, reaction (3) requires a large negative free energy change in order to proceed spontaneously.

where $\Delta G^0$, the standard free energy of reaction for equation (3), is $-226$ kJ $mol^{-1}$ at 735° C. See Linstrom P J and Mallard W G 2001 NIST Chemistry WebBook (NIST Standard Reference Database Number 69, July 2001) National Institute of Standards and Technology Gaithersburg Md. Due to the very small value of $K_e$, the second entropic term in equation (4) is considerable, about 158 kJ $mol^{-1}$ at 735° C. The free energy of reaction for equation (3) is $-68$ kJ $mol^{-1}$.

No effect of quartz on the rate of YBCO formation was observed. Without wanting to be bound by a mechanism, it is believed that formation of YBCO from the fluorinated precursor is not a simple reduction of $BaF_2$ to BaO with subsequent formation of YBCO (Chan et al., Appl. Phys. Lett. 53:1443 (1988) incorporated herein by reference).

Oxygen has no noticeable effect on equation (3) for oxygen pressures up to 500 mTorr. The presence of water vapor partial pressures in the range 100 mTorr-50 Torr does not reduce the efficiency of equation (3).

"A new method of HF control for synthesizing YBCO using the $BaF_2$ ex situ process," Solovyov et al., Supercond. Sci. Technol. 16:L37-L39 (2003) is incorporated herein by reference in its entirety.

Although the invention is described herein with reference to the preferred embodiment, one skilled in the art will readily appreciate that other embodiments may be substituted for those set forth herein without departing from the spirit and scope of the present invention. As such, the described embodiments are not intended to be exhaustive or to limit the invention to the precise forms disclosed, and obviously many modifications and variations are possible in light of the above teaching. The embodiments were chosen and described in order to best explain the principles of the invention and its practical application. It is intended that the scope of the invention be defined by the claims appended hereto and their equivalents.

The invention claimed is:

1. A method for producing a crystalline end-product, the method comprising exposing a fluoride-containing precursor to a hydrogen fluoride absorber under conditions suitable for the conversion of the precursor into the crystalline end-product.

2. The method according to claim 1 wherein the hydrogen fluoride absorber comprises SrO or BaO.

3. The method according to claim 1 wherein the hydrogen fluoride absorber comprises $SrO_2$ or $BaO_2$.

4. The method according to claim 1 wherein the hydrogen fluoride absorber comprises $CaO$, $CaO_2$, $CaOH_2$, limestone or activated carbon.

5. The method according to claim 1 wherein the hydrogen fluoride absorber comprises NaOH, $NaHCO_3$, or $Na_2CO_3$.

6. The method according to claim 1 wherein the end-product is a superconductor.

7. The method according to claim 6 wherein the precursor is a rare earth metal-alkaline earth metal-cuprate precursor.

8. The method according to claim 7 wherein the rare earth metal-alkaline earth metal-cuprate precursor is $YBa_2Cu_3O_y$.

9. The method according to claim 8 wherein y is seven.

10. The method according to claim 1 wherein the end-product is a ferroelectric material.

11. The method according to claim 10 wherein the precursor comprises $Pb(Zr,Ti)O_3$ or $(Ba,Sr)TiO_3$.

12. The method according to claim 1 wherein the conditions suitable for the conversion of the precursor into the crystalline end-product comprises the presence of a hydrogen-containing gas.

13. A method for producing a crystalline superconductor, the method comprising exposing a fluoride-containing precursor to alkaline earth oxide or alkaline earth peroxide under conditions suitable for the conversion of the precursor into the superconductor.

14. The method according to claim 13 wherein the alkaline earth oxide is selected from the group consisting of SrO, and BaO.

15. The method according to claim 13 wherein the alkaline earth peroxide is selected from the group consisting of $SrO_2$ and $BaO_2$.

16. The method according to claim 13 wherein the precursor is a rare earth metal-alkaline earth metal-cuprate precursor.

17. The method according to claim 16 wherein the rare earth metal is yttrium, neodymium, ytterbium, europium, gadolinium, dysprosium, holmium, samarium or a combination thereof.

18. The method according to claim 16 wherein the rare earth metal-alkaline earth metal-cuprate precursor is $YBa_2Cu_3O_y$.

19. The method according to claim 18 wherein y is seven.

* * * * *

UNITED STATES PATENT AND TRADEMARK OFFICE
CERTIFICATE OF CORRECTION

| | | |
|---|---|---|
| PATENT NO. | : 7,622,426 B2 | Page 1 of 1 |
| APPLICATION NO. | : 11/245138 | |
| DATED | : November 24, 2009 | |
| INVENTOR(S) | : Solovyov et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1084 days.

Signed and Sealed this
Third Day of May, 2011

David J. Kappos
*Director of the United States Patent and Trademark Office*